United States Patent [19]
Uematsu et al.

[11] Patent Number: 6,130,640
[45] Date of Patent: *Oct. 10, 2000

[54] RADAR MODULE AND MMIC PACKAGE FOR USE IN SUCH RADAR MODULE

[75] Inventors: Hiroshi Uematsu; Hiroshi Kudoh; Masanobu Urabe, all of Saitama-ken, Japan

[73] Assignee: Honda Giken Kogyo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/823,749

[22] Filed: Mar. 25, 1997

[30] Foreign Application Priority Data

Apr. 3, 1996 [JP] Japan ................................. 8-081764
Jun. 13, 1996 [JP] Japan ................................. 8-174320

[51] Int. Cl.[7] .................................................. G01S 7/28
[52] U.S. Cl. ........................................ 342/175; 342/70
[58] Field of Search ............................. 342/175, 70, 71, 342/72; 455/73; 257/275

[56] References Cited

U.S. PATENT DOCUMENTS

| 5,008,678 | 4/1991 | Herman ................................ | 342/158 |
| 5,115,245 | 5/1992 | Wen et al. ........................... | 342/175 |
| 5,657,024 | 8/1997 | Shingyoji et al. .................. | 342/175 |
| 5,724,042 | 3/1998 | Komatsu et al. .................... | 342/175 |

FOREIGN PATENT DOCUMENTS 4-129402  4/1992  Japan.

*Primary Examiner*—Daniel T. Pihulic
*Attorney, Agent, or Firm*—Lyon & Lyon LLP

[57] ABSTRACT

A radar module includes an antenna assembly, a plurality of transmitting and receiving assemblies, a plurality of circulators, a common signal generator circuit, and a signal distributor all mounted on a dielectric substrate. The transmitting and receiving assemblies may be housed in respective monolithic microwave integrated circuit packages each comprising a metal substrate, a high-frequency integrated circuit mounted on one surface of the metal substrate, and a low-frequency integrated circuit mounted on an opposite surface of the metal substrate and electrically connected to the high-frequency integrated circuit.

31 Claims, 8 Drawing Sheets

RADAR MODULE AND MMIC PACKAGE FOR USE IN SUCH RADAR MODULE

BACKGROUND OF THE INVENTION

1. Field of the Invention

The present invention relates to a radar module for use in an FM millimeter-wave radar alarm system for use on motor vehicles, and an MMIC (Monolithic Microwave Integrated Circuit) package for use in such a radar module.

2. Description of the Prior Art

One known motor vehicle radar alarm system has an electronically scanning planar array antenna as disclosed in U.S. Pat. No. 5,008,678. The disclosed electronically scanning planar array antenna comprises a plurality of transmitting and receiving planar antenna elements, a pair of passive phased arrays such as planar microstrip Butler matrixes, and a pair of electronic switches which are combined to transmit and receive a scanning beam.

The conventional electronically scanning planar array antenna is disadvantageous in that the passive phased arrays thereof cannot scan a relatively large angular range with the scanning beam. Another problem is that the planar array antenna requires both a transmitting array of antenna elements dedicated for transmitting a radar signal and a receiving array of antenna elements dedicated for receiving an echo signal, posing limitations which make it difficult to reduce the size of the planar antenna array and, especially, to install the planar array antenna on a motor vehicle.

Japanese laid-open patent publication No. 4-129402 discloses an MMIC package which may be used in the above electronically scanning planar antenna array. The disclosed MMIC package includes a metal substrate supporting on one surface thereof a high-frequency integrated circuit (MMIC) and a multilayer substrate with a conductive pattern disposed thereon. The MMIC package also includes a low-frequency drive circuit substrate which confronts and is spaced from the high-frequency integrated circuit, the low-frequency drive circuit substrate serving as a lid of the MMIC package. The high-frequency integrated circuit and the low-frequency drive circuit substrate are electrically connected to each other by the conductive pattern on the multilayer substrate and conductive paths on a frame by which the low-frequency drive circuit substrate is mounted on the multilayer substrate.

The high-frequency integrated circuit is enclosed and sealed by the lid, i.e., the low-frequency drive circuit substrate, and the frame. Since they are enclosed and sealed by the low-frequency drive circuit substrate and the frame, the circuits are installed at a high density in the MMIC package even if the MMIC package has a relatively small volume.

However, since the high-frequency integrated circuit on the metal substrate and the low-frequency drive circuit substrate as the lid are electrically connected through the conductive paths on the frame, it is difficult to position the metal substrate and the low-frequency drive circuit substrate accurately with respect to each other for providing electric connections between conductors on those substrates. Therefore, the electric connections that are established between conductors on those substrates are liable to suffer reliability problems.

Particularly if the MMIC package is small in size, junctions for the conductors are also small in dimensions and hence cannot easily be connected physically. As a consequence, the reliability of electric connections between the high-frequency integrated circuit and the low-frequency drive circuit substrate tends to be low.

The MMIC package including the high-frequency integrated circuit and the low-frequency drive circuit substrate cannot be checked for its overall functions until lead terminals are attached to the package assembly and the package assembly is then encased by a molding thereby to complete the MMIC package. Therefore, in the event of a conduction failure detected between the high-frequency integrated circuit and the low-frequency drive circuit substrate by the function check, the lead terminals and the MMIC package become useless, and the time, labor, and cost which have been required to produce the MMIC package are wasted. For the above reasons, the conventional MMIC packages are relatively expensive to manufacture.

Recent high-frequency integrated circuits for use in radar alarm systems on motor vehicles for collision prevention and driving guidance operate in a microwave frequency range from 1 GHz to 3000 GHz. There has been a demand for hybrid ICs comprising high- and low-frequency integrated circuits, which operate in respective GHz and MHz frequency ranges, in order to reduce a packaging space and increase a module density for the purpose of installing a plurality of high-frequency integrated circuits (MMICs) on one substrate.

In such hybrid ICs, it is necessary to position the high- and low-frequency integrated circuits in an appropriate layout to avoid unwanted interference between those high- and low-frequency integrated circuits.

SUMMARY OF THE INVENTION

It is therefore an object of the present invention to provide a radar module and an antenna device which are capable of scanning a relatively large angular range with a scanning beam and which are of a small size suitable for use particularly on motor vehicles.

Another object of the present invention is to provide an MMIC package comprising a high-frequency integrated circuit, and a low-frequency integrated circuit and a bias circuit which are separately mounted on respective opposite surfaces of a metal substrate for installation at a high density and prevention of interference between the high-frequency integrated circuit, and the low-frequency integrated circuit and the bias circuit.

Still another object of the present invention is to provide an MMIC package comprising a high-frequency integrated circuit, and a low-frequency integrated circuit and a bias circuit which are electrically interconnected highly reliably.

According to the present invention, there is provided a radar module comprising a substrate, an antenna assembly mounted on the substrate, the antenna assembly comprising a plurality of transmitting and receiving channels including respective planar array antenna elements each composed of a plurality of patches connected to and spaced along a linear distal end portion of a feeder line, the planar array antenna elements being arrayed in a direction substantially perpendicular to the linear distal end portion of the feeder line, a plurality of transmitting and receiving assemblies mounted on the substrate, for selectively transmitting high-frequency signals to the planar array antenna elements and selectively receiving echo signals from the planar array antenna elements, a plurality of circulators mounted on the substrate and associated with the transmitting and receiving channels, respectively, the circulators connecting the respective linear distal end portions of the feeder lines to transmission and reception end portions which are connected to the transmitting and receiving assemblies, respectively, a common signal generator circuit mounted on the substrate for generating a signal to be supplied to the transmission portions connected to the transmitting assemblies, and a signal distributor mounted on the substrate for distributing the signal generated by the common signal generator circuit through binary branch circuits in plural stages to the transmission portions connected to the transmitting assemblies.

The planar array antenna elements are divided into two groups, the planar array antenna elements of one of the two groups and the planar array antenna elements of the other of the two groups being arranged in an interdigitating pattern and disposed on respective linear distal end portions of feeder lines belonging to the respective groups and extending in opposite directions that are 180° apart from each other.

The common signal generator circuit comprises an FM signal generator for generating an FM signal whose frequency varies substantially linearly, and a frequency multiplier for multiplying the frequency of the FM signal generated by the FM signal generator.

The transmitting and receiving assemblies are grouped into pairs of transmitting and receiving assemblies each belonging to adjacent two of the transmitting and receiving channels, each of the pairs of transmitting and receiving assemblies being housed as monolithic microwave integrated circuit in a package filled with an inert gas. The package has a dielectric partition, and the transmitting and receiving assemblies housed in the package are separated from each other by the dielectric partition.

The substrate comprises a dielectric or magnetic substrate, and the antenna assembly, the common signal generator circuit, the binary branch circuits, the transmitting and receiving assemblies, and the circulators are fabricated as microstrips on the dielectric or magnetic substrate, and wherein the microstrips of selected ones of the antenna assembly, the common signal generator circuit, the binary branch circuits, the transmitting and receiving assemblies, and the circulators are fabricated separately on the dielectric or magnetic substrate and interconnected at a final fabrication stage. The microstrips are interconnected by metal foil or wires.

The antenna assembly serves as a primary radiator of a defocused multiple-beam antenna. The planar array antenna elements are arranged to radiate respective electromagnetic waves at a predetermined tilt angle, the defocused multiple-beam antenna having a secondary radiator positioned closely to the primary radiator.

The high-frequency signals transmitted to the planar array antenna elements comprise frequency-modulated signals, the receiving assemblies including mixers for mixing the echo signals from the planar array antenna elements with the frequency-modulated signals thereby to produce beat signals. The transmitting assemblies include transmission amplifiers for amplifying the high-frequency signals and transmitting the amplified high-frequency signals to the antenna assembly, and the receiving assemblies include reception amplifiers for amplifying the echo signals and supplying the amplified echo signals to the mixers.

According to the present invention, there is also provided a high-frequency module comprising a substrate, an antenna assembly comprising a plurality of planar array antenna elements mounted on a surface of the substrate independently of each other, the planar antenna elements having respective feeder lines, a plurality of monolithic microwave integrated circuits mounted on the surface of the substrate, the monolithic microwave integrated circuits being connected to the feeder lines and positioned closely to each other, and a plurality of bias circuits mounted on an opposite surface of the substrate remotely from the antenna assembly and the monolithic microwave integrated circuits, and electrically connected to the monolithic microwave integrated circuits. The high-frequency module further comprises a plurality of packages mounted on the substrate independently of each other, the monolithic microwave integrated circuits being enclosed and sealed in the packages, respectively. The planar array antenna elements are arrayed in one direction. The monolithic microwave integrated circuits control the directivity of beams transmitted from the planar array antenna elements.

According to the present invention, there is further provided a high-frequency module comprising a substrate, an antenna assembly comprising a plurality of planar array antenna elements mounted on a surface of the substrate independently of each other, the planar antenna elements having respective feeder lines, a plurality of monolithic microwave integrated circuits mounted on the surface of the substrate, the monolithic microwave integrated circuits being connected to the feeder lines and positioned closely to each other, and a plurality of circuits mounted on an opposite surface of the substrate remotely from the antenna assembly and the monolithic microwave integrated circuits, for processing input signals to be supplied to and output signals supplied from the monolithic microwave integrated circuits. The high-frequency module further comprises a plurality of packages mounted on the substrate independently of each other, the monolithic microwave integrated circuits being enclosed and sealed in the packages, respectively. The planar array antenna elements are arrayed in one direction. The monolithic microwave integrated circuits control the directivity of beams transmitted from the planar array antenna elements.

According to the present invention, there is provided a monolithic microwave integrated circuit package comprising a metal substrate, a high-frequency integrated circuit mounted on one surface of the metal substrate, and a low-frequency integrated circuit mounted on an opposite surface of the metal substrate and electrically connected to the high-frequency integrated circuit. The monolithic microwave integrated circuit package further comprises an electrically conductive element extending through the metal substrate from the one surface to the opposite surface, the high-frequency integrated circuit and the low-frequency integrated circuit being electrically connected to each other by the electrically conductive element. The monolithic microwave integrated circuit package further comprises a dielectric substrate mounted on the one surface of the metal substrate, and a terminal mounted on the dielectric substrate for supplying an input signal to and an output signal from the high-frequency integrated circuit. The electrically conductive element comprises a plated through hole.

According to the present invention, there is also provided a monolithic microwave integrated circuit package comprising a metal substrate, a high-frequency integrated circuit mounted on one surface of the metal substrate, and a DC bias circuit mounted on an opposite surface of the metal substrate and electrically connected to the high-frequency integrated circuit. The monolithic microwave integrated circuit package further comprises an electrically conductive element extending through the metal substrate from the one surface to the opposite surface, the high-frequency integrated circuit and the DC bias circuit being electrically connected to each other by the electrically conductive element. The monolithic microwave integrated circuit package further comprises a dielectric substrate mounted on the one surface of the metal substrate, and a terminal mounted on the dielectric substrate for supplying an input signal to and an output signal from the high-frequency integrated circuit. The electrically conductive element comprises a plated through hole.

According to the present invention, there is further provided a monolithic microwave integrated circuit package comprising a metal substrate, a high-frequency integrated circuit mounted on one surface of the metal substrate, and a low-frequency integrated circuit and a DC bias circuit mounted on an opposite surface of the metal substrate and electrically connected to the high-frequency integrated circuit. The monolithic microwave integrated circuit package further comprises an electrically conductive element extending through the metal substrate from the one surface to the opposite surface, the high-frequency integrated circuit and the low-frequency integrated circuit being electrically connected to each other by the electrically conductive element, and the high-frequency integrated circuit and the DC bias circuit being electrically connected to each other by the electrically conductive element. The monolithic microwave integrated circuit package further comprises a dielectric substrate mounted on the one surface of the metal substrate, and a terminal mounted on the dielectric substrate for supplying an input signal to and an output signal from the high-frequency integrated circuit. Each of the electrically conductive elements comprises a plated through hole.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
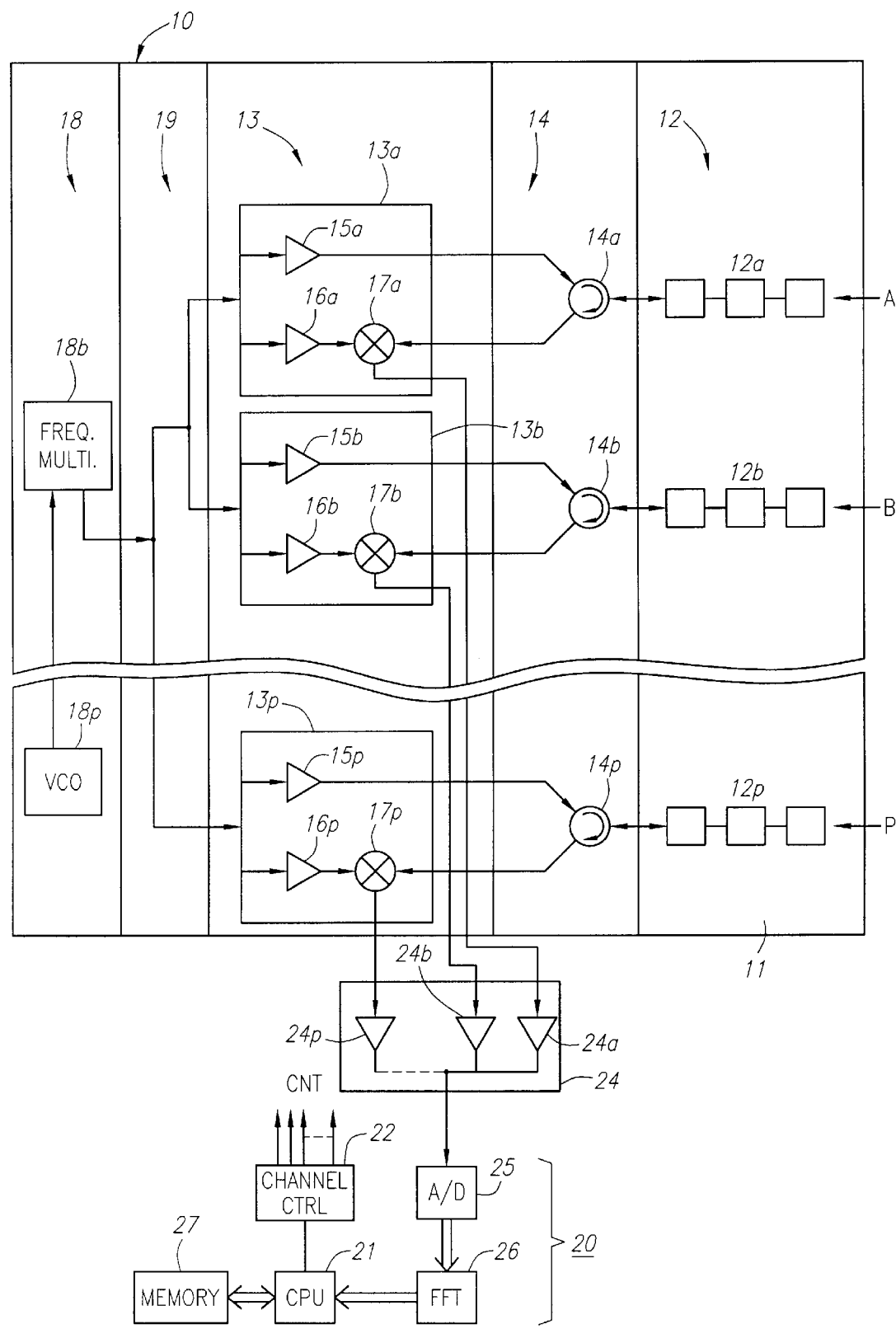
FIG. 1 is a block diagram of an FM radar system which incorporates an FM radar module according to an embodiment of the present invention.

FIG. 1 shows in block form an FM radar system which incorporates an FM radar module according to an embodiment of the present invention.

As shown in FIG. 1, the FM radar system generally comprises an FM radar module 10 according to the present invention and a main radar circuit 20. The FM radar system is preferably installed on a motor vehicle (not shown).

The FM radar module 10 comprises a planar array antenna assembly 12 for transmitting and receiving FM signals, a transmitting and receiving assembly 13, a circulator assembly 14, an FM signal generator circuit 18, and an FM signal distributor 19, which are all mounted on a dielectric substrate 11. The dielectric substrate 11 may be replaced with a magnetic substrate.

The FM radar module 10 has a plurality of (16 in the illustrated embodiment) transmitting and receiving channels A~P. The planar array antenna assembly 12 comprises a plurality of planar array antenna elements 12a~12p belonging respectively to the transmitting and receiving channels A~P. The transmitting and receiving assembly 13 comprises a plurality of transmitting and receiving elements 13a~13p belonging respectively to the transmitting and receiving channels A~P. The circulator assembly 14 comprises a plurality of circulators 14a~14p belonging respectively to the transmitting and receiving channels A~P and connected in series with the planar array antenna elements 12a~12p, respectively, and also with the transmitting and receiving elements 13a~13p, respectively. The FM signal generator circuit 18 is shared by the transmitting and receiving channels A~P. An FM signal generated by the FM signal generator circuit 18 is distributed by the FM signal distributor 19 to the transmitting and receiving elements 13a~13p. The FM signal distributor 19 comprises a plurality of binary branch circuits in the form of microstrips in multiple stages.

The transmitting and receiving elements 13a~13p include respective selective transmission amplifiers 15a~15p, respective selective reception amplifiers 16a~16p, and respective mixers 17a~17p. The transmitting and receiving elements 13a~13p in the respective transmitting and receiving channels A~P receive FM (frequency-modulated) signals to be transmitted which are supplied from the FM signal generator circuit 18 through the FM signal distributor 19.

The FM signal generator circuit 18 comprises an FM signal generator 18a which comprises a voltage-controlled oscillator (VCO) for generating and outputting an FM signal of triangular or sawtooth waveform, and a frequency multiplier 18b for multiplying the frequency of the FM signal generated by the FM signal generator 18a.

The main radar circuit 20 comprises a CPU (central processing unit) 21, a channel controller 22, a selector 24, an A/D (analog-to-digital) converter 25, an FFT (fast Fourier transform) circuit 26, and a memory 27.

Figure 2:
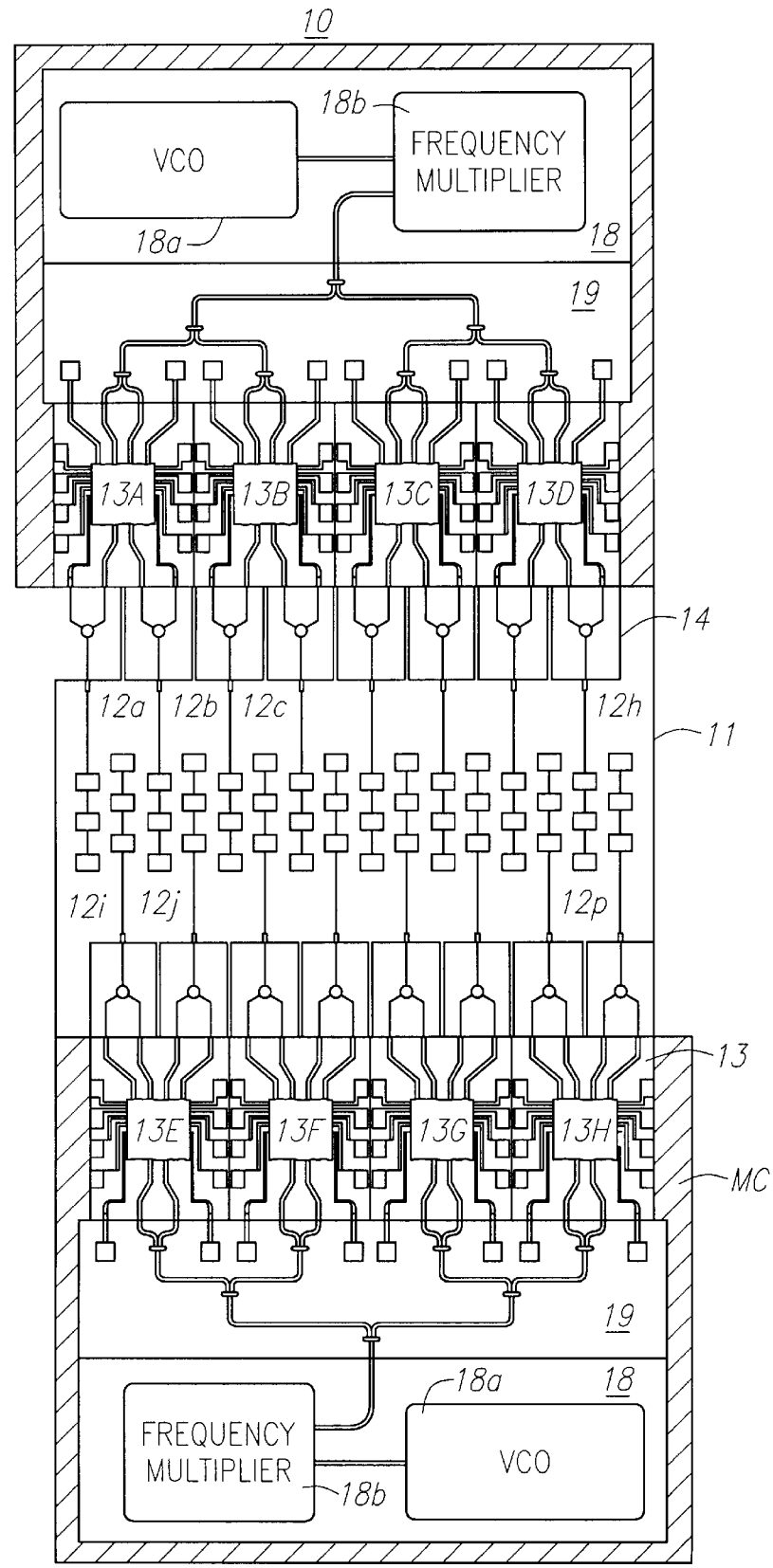
FIG. 2 is a plan view of a physical structure of the FM radar module shown in FIG. 1.

The FM radar module 10 shown in FIG. 1 has a physical structure illustrated in FIG. 2. The FM radar module 10 has a dielectric substrate 11 made of highly pure alumina ceramic having a relative dielectric constant of 9.7, and divided into segments which support respectively thereon the planar array antenna assembly 12, the transmitting and receiving assembly 13, the FM signal generator circuit 18, and the FM signal distributor 19 in the form of microstrips. The transmitting and receiving assembly 13, the FM signal generator circuit 18, and the FM signal distributor 19 are fixedly mounted in a metal casing MC with their dielectric substrate 11 segments and metal plates on their reverse sides being held in contact, and with their microstrips interconnected by metal foil or wires. The circulator assembly 14 is mounted on a ferrite substrate disposed on a metal plate. In a final stage of the process of assembling the FM radar module, the opening of the metal casing MC is closed by a metal plate.

In order for the FM radar module 10 to provide an installation space for the 16 circulators 14a~14p which are relatively large in size, the planar array antenna assembly 12, the transmitting and receiving assembly 13, and the circulator assembly 14 are divided into two groups.

Specifically, the planar array antenna elements 12a~12p are divided into a group of eight planar array antenna elements 12a~12h and a group of eight planar array antenna elements 12i~12p. The eight planar array antenna elements 12a~12h of one group and the eight planar array antenna elements 12i~12p of the other group are arranged in interdigitating pattern and disposed on respective linear distal end portions of feeder lines belonging to the respective groups and extending in opposite directions that are 180° apart from each other. The planar array antenna elements 12a~12h are arrayed in a direction perpendicular to the linear distal end portions of the feeder lines. Each of the planar array antenna elements 12a~12h comprises three patches spaced at given distances along the linear distal end portion of one of the feeder lines.

Figure 3:
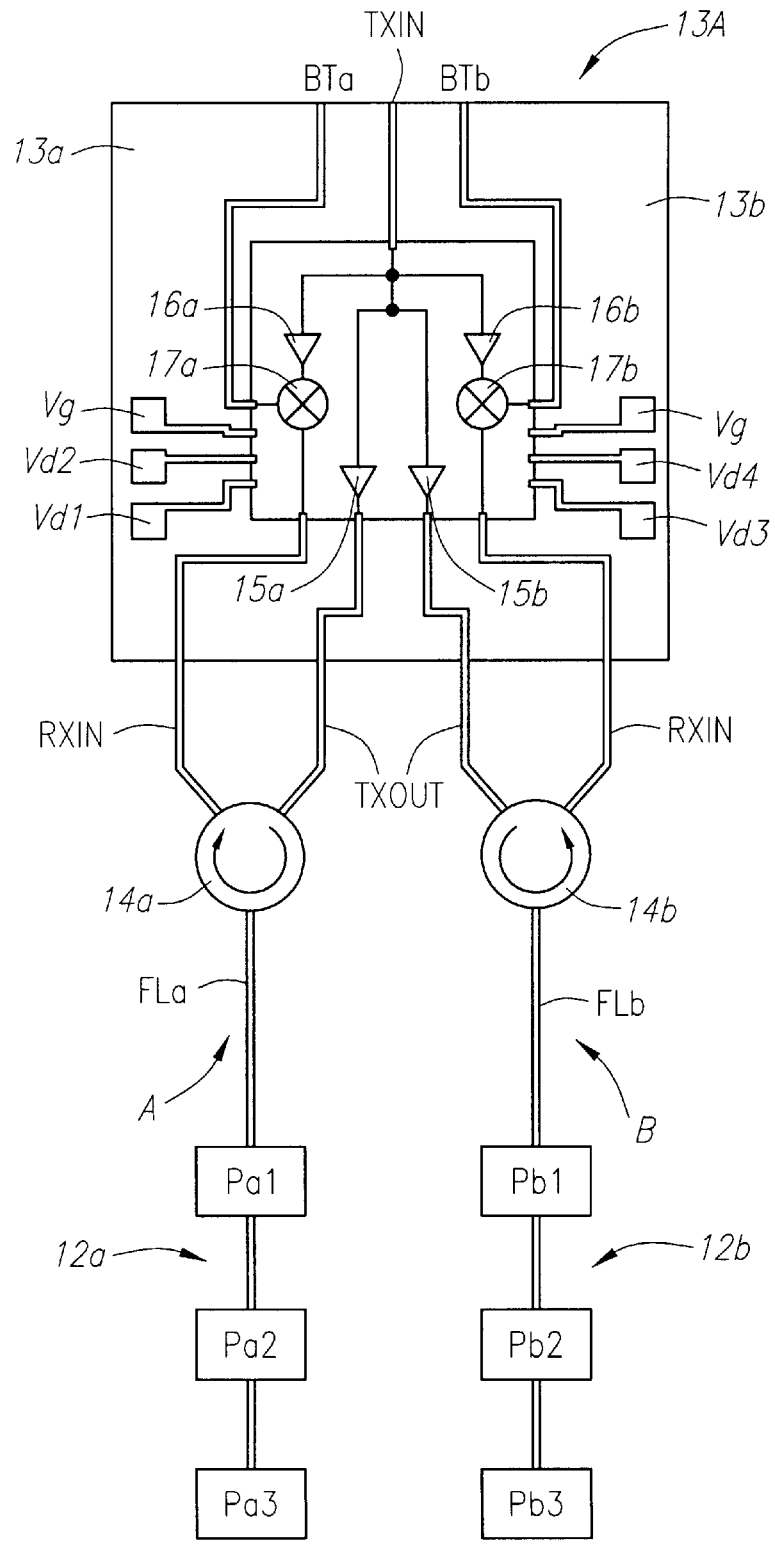
FIG. 3 is an enlarged plan view of one unit of transmitting and receiving channels of the FM radar module shown in FIG. 2.

The transmitting and receiving elements 13a~13p are fabricated as eight MMIC (Monolithic Microwave Integrated Circuit) packages 13A~13H on a GaAs semiconductor substrate. The eight MMIC packages 13A~13H are divided into two groups. Each of the eight MMIC packages 13A~13H is composed of the transmitting and receiving elements of adjacent two of the 16 transmitting and receiving channels A~P, as shown in FIG. 3 which illustrates only the MMIC package 13A. Specifically, the MMIC package 13A shown in FIG. 3 is composed of the selective transmission amplifier 15a, the selective reception amplifier 16a, and the mixer 17a which belong to the transmitting and receiving element 13a of the transmitting and receiving channel A, and the selective transmission amplifier 15b, the selective reception amplifier 16b, and the mixer 17b which belong to the transmitting and receiving element 13b of the transmitting and receiving channel B. The GaAs semiconductor substrate with the MMIC packages 13A~13H thereon is housed in a ceramic package which is filled with a nitrogen gas.

As shown in FIG. 3, the planar array antenna 12a, which is composed of three rectangular patches $Pa_1$, $Pa_2$, $Pa_3$ of the transmitting and receiving channel A is connected to the linear distal end portion of a feeder line FLa, whose proximal end portion is divided into a transmission end portion TXOUT and a reception end portion RXIN by the circulator 14a. The rectangular patches $Pa_1$, $Pa_2$, $Pa_3$ are spaced a certain distance along the linear distal end portion of the feeder line FLa. The transmission end portion TXOUT separated by the circulator 14a is connected through the selective transmission amplifier 15a to an input terminal TXIN of the MMIC package 13A for receiving an FM signal from the FM signal generator circuit 18. The reception end portion RXIN separated by the circulator 14a is connected to an input terminal, i.e., a received signal input terminal, of the mixer 17a. The other input terminal, i.e., a local oscillator input terminal, of the mixer 17a is selectively supplied with an FM signal from the input terminal TXIN through the selective reception amplifier 16a.

Similarly, the planar array antenna 12b, which is composed of rectangular patches $Pb_1$, $Pb_2$, $Pb_3$ of the transmitting and receiving channel B is connected to the linear distal end portion of a feeder line FLb, whose proximal end portion is divided into a transmission end portion TXOUT and a reception end portion RXIN by the circulator 14b. The rectangular patches $Pb_1$, $Pb_2$, $Pb_3$ are spaced a certain distance along the linear distal end portion of the feeder line FLb. The transmission end portion TXOUT separated by the circulator 14b is connected through the selective transmission amplifier 15b to the input terminal TXIN of the MMIC package 13A for receiving an FM signal from the FM signal generator circuit 18. The reception end portion RXIN separated by the circulator 14b is connected to an input terminal of the mixer 17b. The other input terminal of the mixer 17b is selectively supplied with an FM signal from the input terminal TXIN through the selective reception amplifier 16b.

The selective transmission amplifiers 15a, 15b and the selective transmission amplifiers 16a, 16b of the transmitting and receiving channels A, B are composed mainly of high-frequency FETs (field-effect transistors). These four selective amplifiers 15a, 15b, 16a, 16b intermittently amplify supplied input signals in response to respective intermittent drain voltages Vd1~Vd4 selectively supplied from the channel controller 22 of the main radar circuit 20. The four selective amplifiers 15a, 15b, 16a, 16b are also supplied with a constant gate voltage Vg.

DC magnetic fields in mutually opposite directions are applied to the circulators 14a, 14b, respectively, for rotating signals in mutually opposite directions in the circulators 14a, 14b. The application of DC magnetic fields in mutually opposite directions to the circulators 14a, 14b is effective to cancel those DC magnetic fields and prevent a DC magnetic field from being generated.

Figure 4:
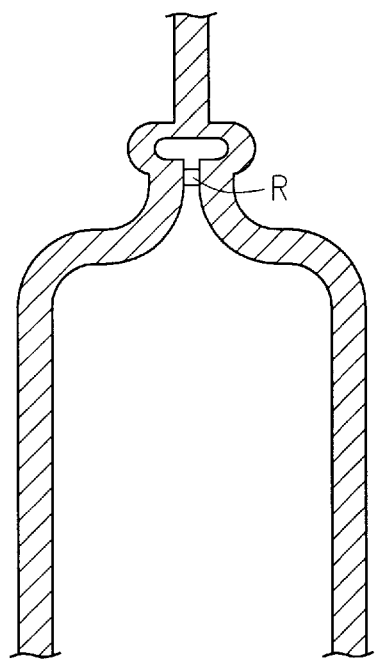
FIG. 4 is an enlarged fragmentary plan view of each signal branching circuit of an FM signal distributor in the FM radar module shown in FIG. 1.

FIG. 4 shows fragmentarily at an enlarged scale each signal branching circuit of the FM signal distributor 19 in the FM radar module shown in FIG. 1. For impedance matching of the signal branching circuit, a thin-film resistor R having a resistance of about 100 Ω is inserted between branched arms of a microstrip of the signal branching circuit.

Figure 5:
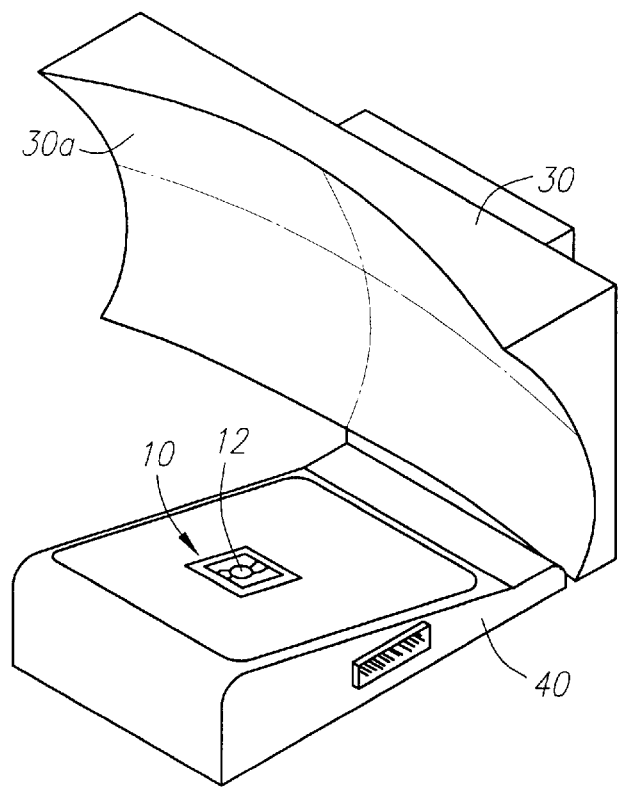
FIG. 5 is a perspective view of the FM radar system which incorporates the FM radar module shown in FIG. 1.

FIG. 5 illustrates in perspective the FM radar system which incorporates the FM radar module 10 shown in FIG. 1. As shown in FIG. 5, the FM radar module 10 is housed in a metallic holder 40 and integrally combined with a secondary radiator 30 by the metallic holder 40, with the antenna assembly 12 serving as a primary radiator. The secondary radiator 30 has a parabolic reflecting surface 30a, and the antenna assembly 12 composed of the 16 planar array antenna elements 12a~12p is positioned in the vicinity of the focal point of the parabolic radiating surface 30a. FM signals in a millimeter wavelength range which are radiated from the respective planar array antenna elements 12a~12p are reflected by the parabolic reflecting surface 30a and radiated at respective different angles or bearings in a horizontal direction forwardly of the secondary radiator 30. The primary radiator composed of the antenna assembly 12 and the secondary radiator 30 jointly make up an offset defocused multiple-beam parabolic antenna.

Figure 6:
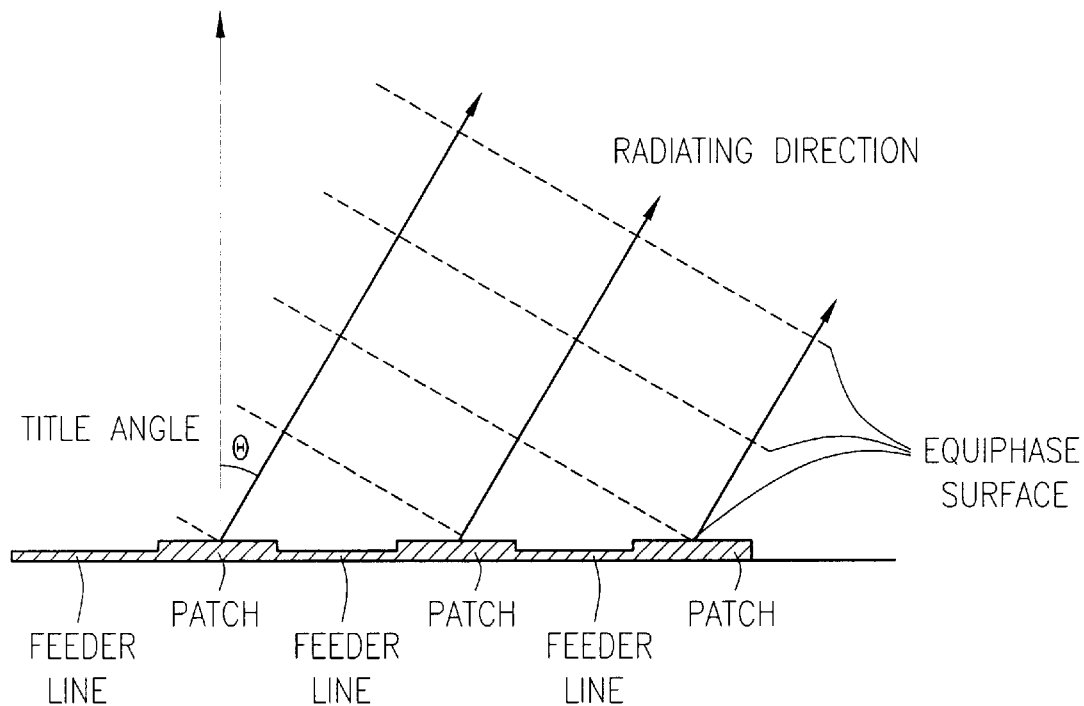
FIG. 6 is a diagram illustrative of a tilt angle of planar array antenna elements of the FM radar module shown in FIG. 1.

In each of the planar array antenna elements 12a~12p, the three rectangular patches are spaced a certain distance from each other along the linear distal end portion of the feeder line. Electromagnetic waves are radiated at a certain tilt angle from the respective planar array antenna elements 12a~12p. Specifically, as shown in FIG. 6, the direction (indicated by the solid lines) in which the electromagnetic waves radiated from the respective patches is inclined at a tilt angle θ to a line (indicated as the dot-and-dash line) normal to the dielectric substrate 11 such that equiphase surfaces (indicated by the dotted lines) of the electromagnetic waves radiated from the respective patches lie perpendicularly to the direction in which they are radiated from the respective patches. The equiphase surfaces of the radiated electromagnetic waves are determined by a delay time which is caused when the signals are propagated through the feeder lines and the electromagnetic waves are propagated through the air.

While the patches are shown thicker than the feeder line in FIG. 6 for distinguishing the patches from the feeder line, they are so shown for illustrative purpose only and are actually of the same thickness. The length of the feeder line portion that interconnects the three patches of each of the eight planar array antenna elements of one group is substantially half wavelength different from the length of the feeder line portion that interconnects the three patches of each of the eight planar array antenna elements of the other group so that the electromagnetic waves will be radiated from the planar array antenna elements of the two groups at the same angle toward the secondary radiator.

As shown in FIG. 5, since each of the planar array antenna elements 12a~12p radiates the electromagnetic wave at the tilt angle θ as described above, the FM radar module 10 which is considerably large in size compared with the primary radiator is effectively prevented from interfering with the electromagnetic waves radiated from the secondary radiator 30. Accordingly, the FM radar module 10 that includes the antenna assembly 12 as the primary radiator can be positioned near the secondary radiator 30. With this arrangement, the FM radar module 10 is allowed to be of an MMIC-based structure which is made up of the MMIC packages 13A~13H composed of the transmitting and receiving assembly 13 and the antenna assembly 12 on the dielectric substrate 11.

The antenna assembly 12 as the primary radiator having a tilt angle is combined with the secondary radiator 30 having the porabolic reflecting surface 30a in the illustrated embodiment. However, the antenna assembly may comprise a primary radiator with no tilt angle and may be combined with a dielectric lens. Alternatively, if the directivity of the primary radiator is to be increased or a range for detecting objects which reflect FM signals is limited to a region near the motor vehicle on which the FM radar system is installed, then the secondary radiator such as a reflecting surface or a dielectric lens may be dispensed with, and the antenna assembly may comprise only planar array antenna elements.

Referring back to FIG. 1, an FM millimeter-wave signal supplied from the FM signal generator circuit 18 is distributed as FM signals that are selectively amplified only in given periods by the respective selective transmission amplifiers 15a~15p in the respective transmitting and receiving channels A~P. Specifically, the selective transmission amplifiers 15a~15p amplify the respective FM signals only in successive periods according to channel control signals supplied from the channel controller 22.

More specifically, each of the selective transmission amplifiers 15a~15p comprises two cascaded FETs (Field-Effect Transistors) and switching transistors for intermittently supplying an operating drain voltage to the FETs according to the channel control signal, and selectively amplifies the FM millimeter-wave signal only in a period in which operating electric energy is supplied thereto. Unless a drain voltage is supplied, each of the selective transmission amplifiers 15a~15p imparts a large insertion loss to the FM millimeter-wave signal passing therethrough, virtually separating the FM signal generator circuit 18 and the corresponding one of the circulators 14a~14p.

Therefore, each of the selective transmission amplifiers 15a~15p functions as a switch having such a gain for selectively connecting the FM signal generator circuit 18 to and disconnecting the FM signal generator circuit 18 from the corresponding one of the circulators 14a~14p. The FM millimeter-wave signals amplified by the respective selective transmission amplifiers 15a~15p are supplied through the respective circulators 14a~14p to the respective planar array antenna elements 12a~12p, which then radiate the FM millimeter-wave signals as electromagnetic waves away from the dielectric substrate 11 toward the secondary radiator 30 (see FIG. 5). The radiated electromagnetic waves are reflected by the porabolic reflecting surface 30a of the secondary radiator 30 out of the motor vehicle on which the FM radar system is installed. In this manner, the directivity of signal beams from the planar array antenna elements 12a~12p is controlled by the selective transmission amplifiers 15a~15p.

Some of the FM millimeter-wave signals radiated as electromagnetic waves out of the motor vehicle are reflected by objects, travel back to and are received by the planar array antenna elements 12a~12p. The reflected electromagnetic waves which are received by the planar array antenna elements 12a~12p are separated as FM echo signals from the transmitting channels by the circulators 14a~14p, respectively. The separated FM echo signals are supplied to the respective received signal input terminals of the mixers 17a~17p. The other local oscillator input terminals of the mixers 17a~17p are supplied with amplified FM millimeter-wave signals from the selective reception amplifiers 16a~16p which successively amplify FM millimeter-wave signals intermittently only in given periods according to channel control signals supplied from the channel controller 22. The selective reception amplifiers 16a~16p function as respective switches as with the selective transmission amplifiers 15a~15p.

Beat signals outputted from respective output terminals of the mixers 17a~17p are transmitted through output terminals BTa, BTb to the selector 24. In the selector 24, the beat signals are amplified by respective amplifiers 24a~24b whose amplification factor varies depending on the frequency. The amplifiers 24a~24b are selected in a time-sharing fashion by the channel controller 22 to supply the amplified beat signals through a coaxial cable to the A/D converter 25, which converts the beat signals into digital beat signals. The digital beat signals are then supplied to the FFT circuit 26, and converted thereby into a frequency spectrum that is then supplied to the CPU 21.

Figure 7:
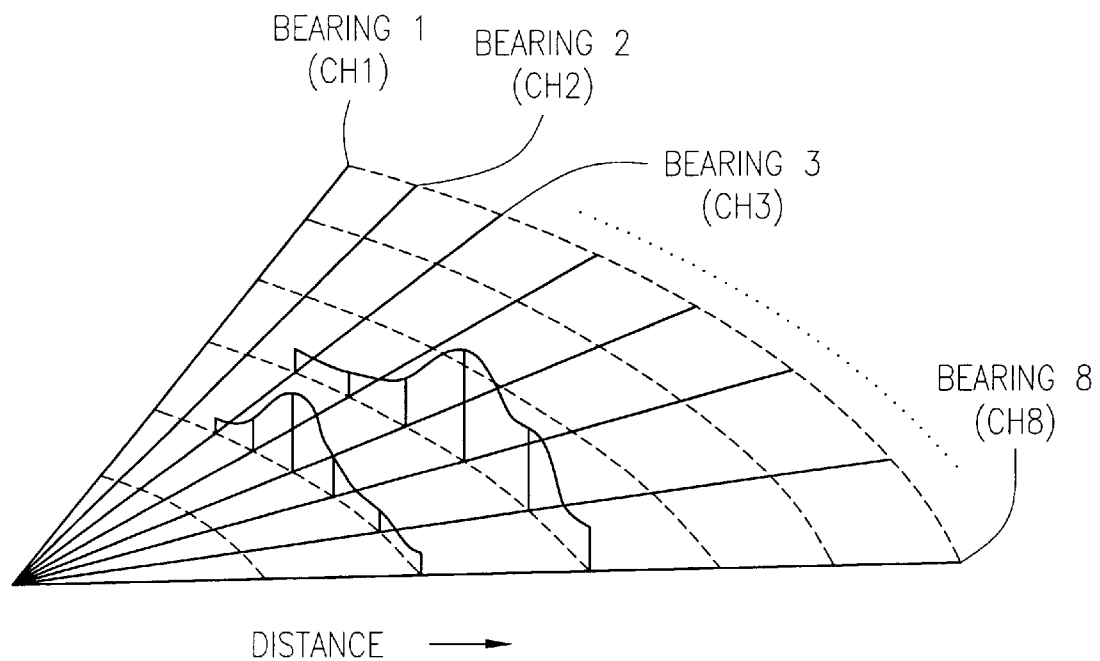
FIG. 7 is a diagram showing distances to echo-generating objects that are detected by the FM radar system which incorporates the FM radar module shown in FIG. 1 and a distribution of bearings covered by the FM radar system.

The CPU 21 analyzes the frequency spectrum of the received FM echo signals supplied from the FFT circuit 26, and calculates distances to the objects which have produced the FM echo signals in the respective transmitting and receiving channels and hence at respective bearings. Typically, the CPU 21 generates a two-dimensional map of obstacles to the motor vehicle as shown in FIG. 7.

Figure 8:
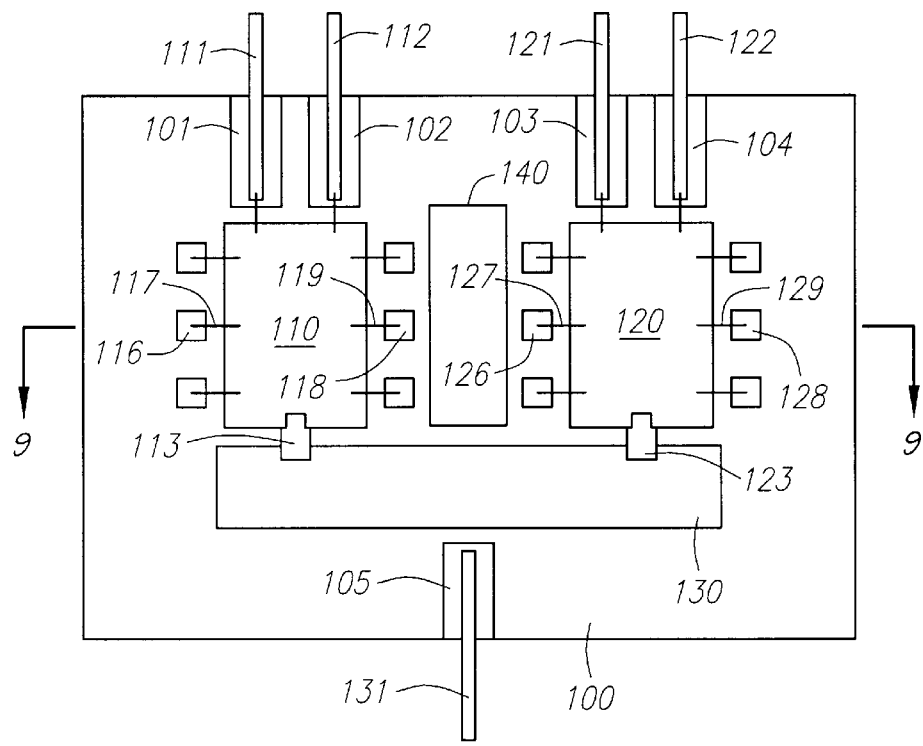
FIG. 8 is a plan view of an MMIC of an FM radar module according to another embodiment of the present invention.
Figure 9:
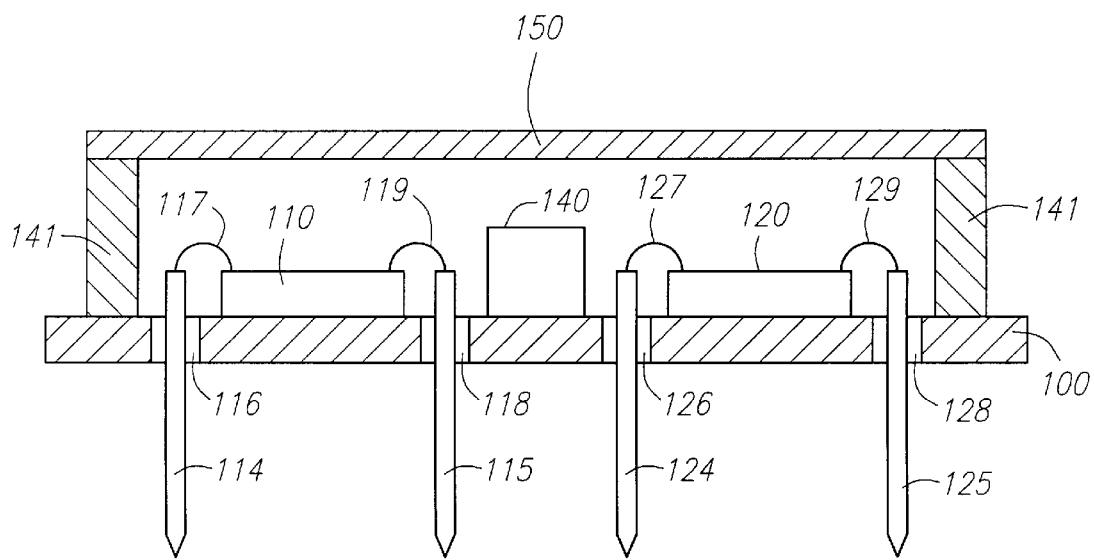
FIG. 9 is a cross-sectional view taken along line IX—IX of FIG. 8.

FIGS. 8 and 9 show an MMIC package of an FM radar module according to another embodiment of the present invention. As shown in FIGS. 8 and 9, the MMIC package comprises a metal substrate 100 with dielectric substrates 101, 102, 103, 104, 105, 130 of aluminum, for example, mounted on one surface thereof, and a pair of MMICs 110, 120 mounted on the surface of the metal substrate 100.

Signal output terminals 111, 121 are mounted respectively on the dielectric substrates 101, 103, and signal input terminals 112, 122 are mounted respectively on the dielectric substrates 102, 104. A signal input terminal 131 for receiving a supplied FM signal is mounted on the dielectric substrate 105. An FM signal received through the signal input terminal 131 is divided into two FM signals by a binary branch circuit in the form of a microstrip (not shown) on the dielectric substrate 130, and the two FM signals are supplied through respective beam leads 113, 123 to the MMICs 110, 120. The MMICs 110, 120 include respective selective transmission amplifiers, respective selective reception amplifiers, and respective mixers (not shown). The MMICs 110, 120 are separated from each other by a dielectric partition 140 mounted on the metal substrate 100 for allowing the resonant frequency of a cavity in the MMIC package to be higher than the frequency band of the FM signal.

FM signals to be transmitted are supplied from the MMICs 110, 120 through the signal output terminals 111, 121 to circulators (not shown). FM signals which are received are supplied from the circulators through the signal input terminals 112, 122 to the MMICs 110, 120. Beat signals which are generated by the MMICs 110, 120 are sent through bonding wires 119, 129 to respective output terminals 115, 125 (see FIG. 9) which are connected to the bonding wires 119, 129 and extend through the metal substrate 100 to a reverse side thereof remotely from the MMICs 110, 120. The beat signals are then delivered form the output terminals 115, 125 through respective coaxial cables (not shown) to a main radar circuit (not shown). A bias voltage and amplifier control signals are supplied through signal terminals 114, 124 and bonding wires 117, 127 to the MMICs 110, 120. The signal terminals 114, 124 are connected to the bonding wires 117, 127 and extend through the metal substrate 100 to the reverse side thereof remotely from the MMICs 110, 120.

As shown in FIG. 9, the MMIC package further includes a lid 150 mounted on the metal substrate 100 by a frame 141. The terminals 114, 115, 124, 125 are supported on the metal substrate 100 by respective insulators 116, 118, 126, 128 which hermetically seal the cavity that is defined by the metal substrate 110, the lid 150, and the frame 141 and filled with an inert gas. The lid 150 and the frame 141 are omitted from illustration in FIG. 8.

The principles of the present invention, which have been described as being embodied as an FM radar module, are also applicable to any of various other radar modules including an AM radar module, a pulse radar module, etc.

The FM radar module according to the present invention offers the following various advantages:

Since the plurality of small-size planar array antenna elements are arrayed so as to be shared by the transmitting and receiving assemblies through the circulators, the number of planar array antenna elements may be increased in a limited installation space, making it possible to scan a relatively large angular range with a scanning beam. The planar array antenna elements serve as a primary radiator in an offset defocused multiple-beam parabolic antenna for wide scanning angular range and high bearing resolution.

Since the planar array antenna elements are combined with the circulators so as to be shared by the transmitting and receiving assemblies, the various components of the antenna assembly 12 are mounted in a high-density configuration. Specifically, the selective transmission and reception amplifiers and the mixers in the form of MMICs are mounted on the single dielectric substrate, making up the antenna assembly 12 serving as the primary radiator. An FM radar system of the scanning type which incorporates the antenna assembly 12 is of a high-density structure, a small size, a low cost, and high resolution, suitable for use on motor vehicles. The FM radar system can be used in a wide range of motor vehicle applications including an active cruise control system, a collision prevention system, etc.

The FM signal generator circuit 18 and the FM signal distributor 19 are included in the FM radar module 10, rather than the main radar circuit 20. This arrangement is effective in reducing the size and cost of the FM radar system.

The FM radar system has been described as a motor vehicle radar system. However, the principles of the present invention are also applicable to a general communication system such as a high-frequency local area network (LAN) for interior use.

Figure 10:
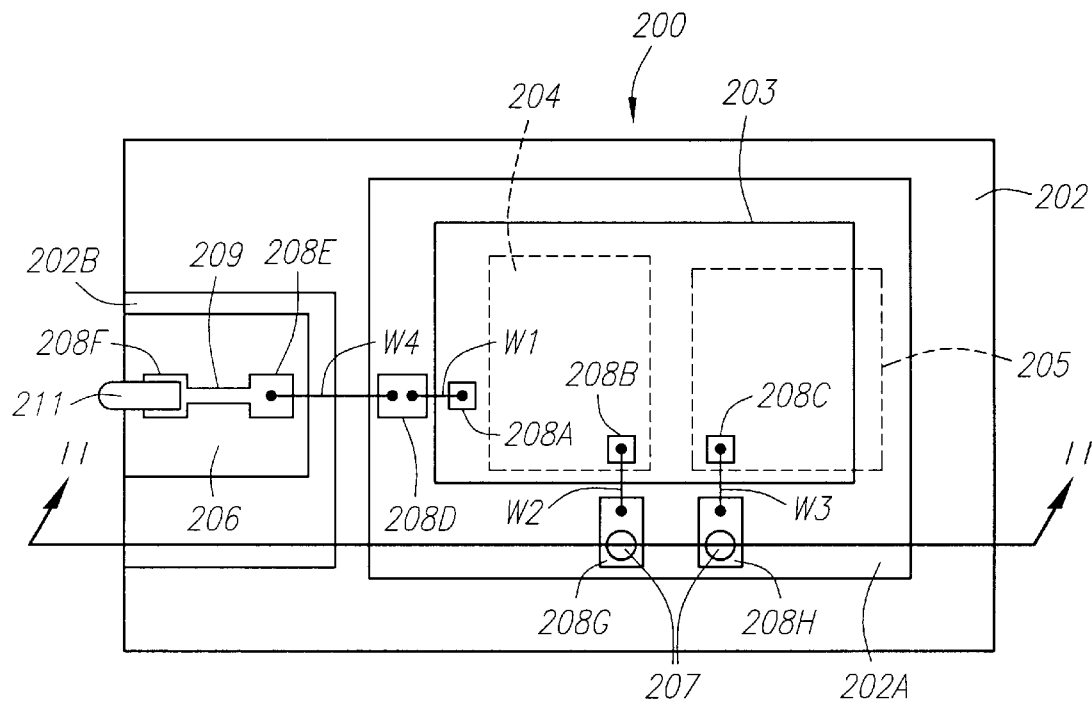
FIG. 10 is a plan view of an MMIC package according to the present invention, which may be incorporated in the FM radar module shown in FIG. 1.
Figure 11:
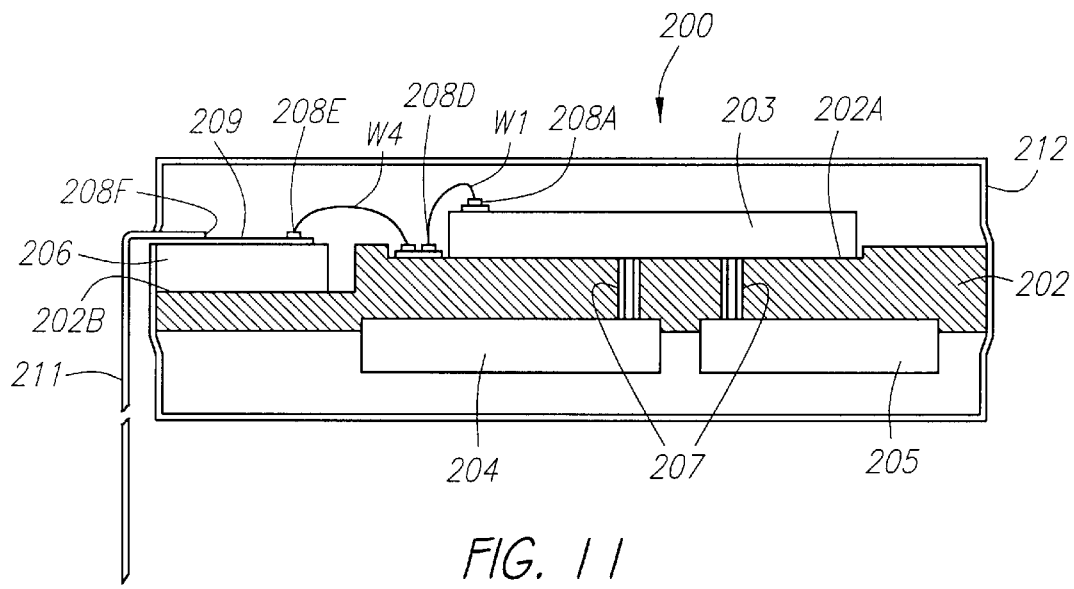
FIG. 11 is a cross-sectional view taken along line XI—XI of FIG. 10.

FIGS. 10 and 11 another MMIC package according to the present invention, which may be incorporated in the FM radar module shown in FIG. 1. As shown in FIGS. 10 and 11, the MMIC package, generally denoted at 200, is of a hybrid IC structure which comprises a metal substrate 202, a high-frequency integrated circuit (MMIC) 203 and a dielectric substrate 206 which are mounted on one surface of the metal substrate 202, and a low-frequency integrated circuit 204 and a DC bias circuit 205 which are mounted on the opposite surface of the metal substrate 202. The MMIC package 200 also has a case 212 of molded synthetic resin, ceramic, or metal which houses the above components of the MMIC package 200.

As described above, the high-frequency integrated circuit 203 which operates in a GHz frequency range is mounted on one surface of the metal substrate 202, and the low-frequency integrated circuit 204 which operates in a MHz GHz frequency range and the DC bias circuit 205 which supplies electric energy and a DC bias to the high-frequency integrated circuit 203 are mounted on the opposite surface of the metal substrate 202. Therefore, the MMIC package 200 has many IC chips housed in a limited space.

Since the high-frequency integrated circuit 203, and the low-frequency integrated circuit 204 and the DC bias circuit 205 are separated from each other by the metal substrate 202, they are prevented from interfering with each other though they operate in different frequency ranges.

The high-frequency integrated circuit 203, the low-frequency integrated circuit 204, and the DC bias circuit 205 have ground terminals connected to the metal substrate 202 for effective prevention of interference between the high-frequency integrated circuit 203, the low-frequency integrated circuit 204, and the DC bias circuit 205.

The metal substrate 202, which is made of Kovar or the like has recesses 202A, 202B defined in the one surface thereof, and the high-frequency integrated circuit 203 and the dielectric substrate 206 are disposed in the recesses 202A, 202B, respectively.

Bonding pads 208D, 208G, 208H are formed by evaporation or the like on insulating layers on the bottom of the recess 202A, and electrically connected by respective thin wires W1, W2, W3 made of gold or the like to respective bonding pads 208A, 208B, 208C mounted on the high-frequency integrated circuit 203.

The bonding pads 208G, 208H has through-hole regions 207 which extend through the metal substrate 202 from one surface to the opposite surface thereof. The through-hole regions 207 are formed by the fine-circuitry fabrication technique of the semiconductor manufacturing process. The high-frequency integrated circuit 203 and the low-frequency integrated circuit 204 are electrically connected to each other by one of the through-hole regions 207, and the high-frequency integrated circuit 203 and the DC bias circuit 205 are electrically connected to each other by the other through-hole region 207. Specifically, bonding pads (not shown) are mounted on the opposite surface of the metal substrate 202 in alignment with the bonding pads 208G, 208H, and electrically connected to the bonding pads 208G, 208H by the respective through-hole regions 207. The low-frequency integrated circuit 204 and the DC bias circuit 205 also have respective bonding pads (not shown) which are electrically connected by wires to the bonding pads that are mounted on the opposite surface of the metal substrate 202 in alignment with the bonding pads 208G, 208H. Accordingly, the high-frequency integrated circuit 203 on one surface of the metal substrate 202, and the low-frequency integrated circuit 204 and the DC bias circuit 205 on the other surface of the metal substrate 202 are electrically connected to each other highly reliably through the through-hole regions 207.

The dielectric substrate 206 is made of highly pure alumina ceramic, for example, and has its exposed surface lying flush with the surface of the metal substrate 202.

A bonding pad 208E, a terminal 208F, and a conductive pattern 209 are formed on the exposed surface of the dielectric substrate 206 by evaporation or the like. The bonding pad 208E and the bonding pad 208D are connected to each other by a wire W4 of gold or the like, and an IC lead 211 is connected to the terminal 208F for supplying an input signal from an external source to the high-frequency integrated circuit 203 or delivering an output signal from the high-frequency integrated circuit 203 to an external circuit.

Because the dielectric substrate 206 lies flush with the metal substrate 202 on which the high-frequency integrated circuit 203 is disposed and the bonding pad 208E and the terminal 208F are mounted on the dielectric substrate 206, the terminal 208F for the high-frequency integrated circuit 203 lies in a horizontal plane of the high-frequency integrated circuit 203.

Figure 12:
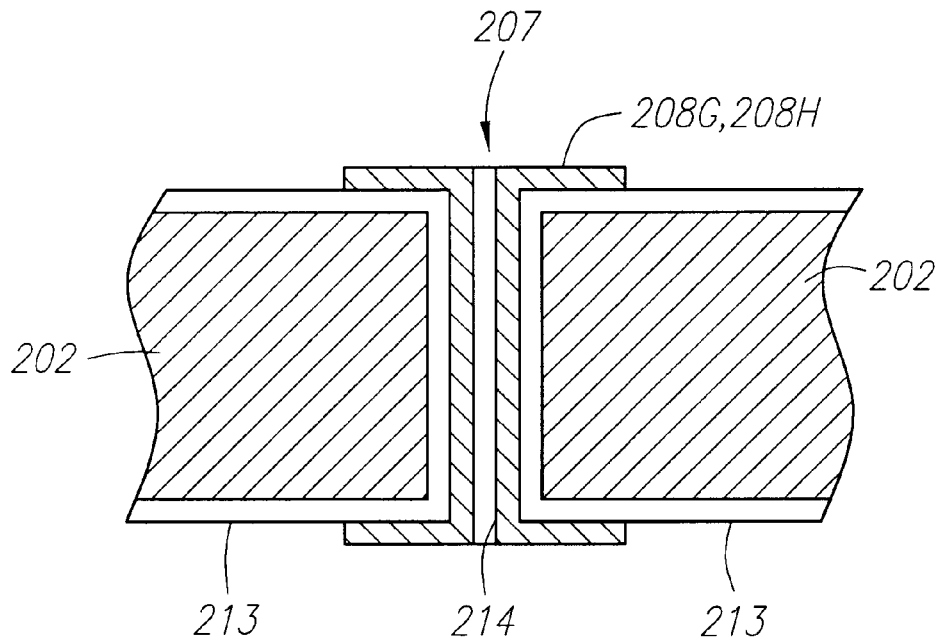
FIG. 12 is an enlarged fragmentary cross-sectional view of each of through-hole regions in the MMIC package shown in FIG. 11.

FIG. 12 shows each of the through-hole regions 207 in enlarged fragmentary cross section. As shown in FIG. 3, the through-hole region 207 has a through hole extending from one surface to the other of the metal substrate 202. An insulating layer 213 is deposited on the surfaces of the metal substrate 202 wider than the through-hole region 207, and also on the wall of the through hole. Thereafter, a conductive layer is deposited on the insulating layer 213, producing the bonding pads 208G, 208G and a plated through hole 214 which electrically interconnects the bonding pads 208G, 208G through a shortest distance.

Figure 13:
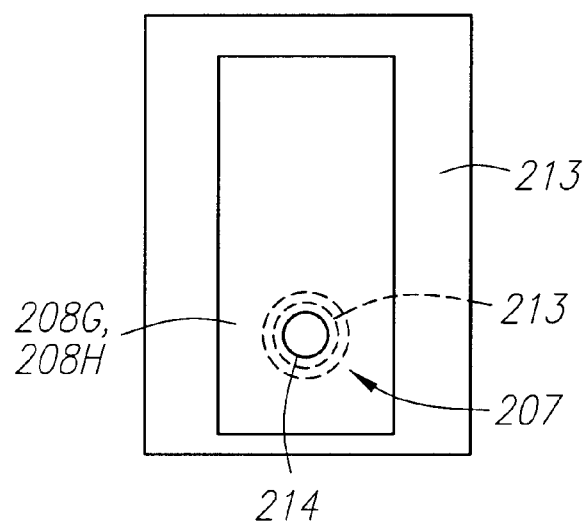
FIG. 13 is an enlarged plan view of the through-hole region shown in FIG. 12.

FIG. 13 shows in plan the through-hole region 207 illustrated in FIG. 12. As shown in FIG. 13, the insulating layer 213 underlies the bonding pads 208G, 208H, and the insulating layer 213 with the plated through hole 214 defined therein is deposited concentrically on the wall of the through hole which extends from one surface to the other of the metal substrate 202.

While each of the bonding pads 208G, 208H has one plated through hole 214 in FIGS. 10 through 13, it may have a plurality of plated through holes in view of the reliability of the plated through holes. Furthermore, the plated through hole 214 may be replaced with a conductive element to provide an electrically interconnection between the circuits on the opposite surfaces of the metal substrate 202.

Although certain preferred embodiments of the present invention have been shown and described in detail, it should be understood that various changes and modifications may be made therein without departing from the scope of the appended claims.

What is claimed is:

1. A radar module comprising:

a substrate;

an antenna assembly mounted on said substrate, said antenna assembly comprising a plurality of transmitting and receiving channels including respective planar array antenna elements each composed of a plurality of patches connected to and spaced along a linear distal end portion of a feeder line, said planar array antenna elements being arrayed in a direction substantially perpendicular to the linear distal end portion of the feeder line;

a plurality of transmitting and receiving assemblies mounted on said substrate, for selectively transmitting high-frequency signals to said planar array antenna elements and selectively receiving echo signals from said planar array antenna elements;

a plurality of circulators mounted on said substrate and associated with the transmitting and receiving channels, respectively, said circulators connecting the respective linear distal end portions of the feeder lines to transmission and reception end portions which are connected to the transmitting and receiving assemblies, respectively;

a common signal generator circuit mounted on said substrate for generating a signal to be supplied to the transmission portions connected to the transmitting assemblies; and a signal distributor mounted on said substrate for distributing the signal generated by said common signal generator circuit through binary branch circuits in plural stages to said transmission portions connected to the transmitting assemblies.

2. A radar module according to claim 1, wherein said planar array antenna elements are divided into two groups, the planar array antenna elements of one of the two groups and the planar array antenna elements of the other of the two groups being arranged in an interdigitating pattern and disposed on respective linear distal end portions of feeder lines belonging to the respective groups and extending in opposite directions that are 180° apart from each other.

3. A radar module according to claim 1, wherein said common signal generator circuit comprises an FM signal generator for generating an FM signal whose frequency varies substantially linearly, and a frequency multiplier for multiplying the frequency of the FM signal generated by the FM signal generator.

4. A radar module according to claim 1, wherein said transmitting and receiving assemblies are grouped into pairs of transmitting and receiving assemblies each belonging to adjacent two of said transmitting and receiving channels, each of said pairs of transmitting and receiving assemblies being housed as monolithic microwave integrated circuit in a package filled with an inert gas.

5. A radar module according to claim 4, wherein said package has a dielectric partition, and said transmitting and receiving assemblies housed in said package are separated from each other by said dielectric partition.

6. A radar module according to claim 1, wherein said substrate comprises a dielectric or magnetic substrate, and said antenna assembly, said common signal generator circuit, said binary branch circuits, said transmitting and receiving assemblies, and said circulators are fabricated as microstrips on said dielectric or magnetic substrate, and wherein the microstrips of selected ones of said antenna assembly, said common signal generator circuit, said binary branch circuits, said transmitting and receiving assemblies, and said circulators are fabricated separately on said dielectric or magnetic substrate and interconnected at a final fabrication stage.

7. A radar module according to claim 6, wherein said microstrips are interconnected by metal foil or wires.

8. A radar module according to claim 1, wherein said antenna assembly serves as a primary radiator of a defocused multiple-beam antenna.

9. A radar module according to claim 8, wherein said planar array antenna elements are arranged to radiate respective electromagnetic waves at a predetermined tilt angle, said defocused multiple-beam antenna having a secondary radiator positioned closely to said primary radiator.

10. A radar module according to claim 1, wherein said high-frequency signals transmitted to said planar array antenna elements comprise frequency-modulated signals, said receiving assemblies including mixers for mixing the echo signals from said planar array antenna elements with said frequency-modulated signals thereby to produce beat signals.

11. A radar module according to claim 10, wherein said transmitting assemblies include transmission amplifiers for amplifying the high-frequency signals and transmitting the amplified high-frequency signals to said antenna assembly, and said receiving assemblies include reception amplifiers for amplifying the echo signals and supplying the amplified echo signals to said mixers.

12. A high-frequency module comprising:
a substrate;
an antenna assembly comprising a plurality of planar array antenna elements mounted on a surface of said substrate independently of each other, said planar antenna elements having respective feeder lines;
a plurality of monolithic microwave integrated circuits mounted on said surface of the substrate, said monolithic microwave integrated circuits being connected to said feeder lines and positioned closely to each other; and
a plurality of bias circuits mounted on an opposite surface of said substrate remotely from said antenna assembly and said monolithic microwave integrated circuits, and electrically connected to said monolithic microwave integrated circuits.

13. A high-frequency module according to claim 12, further comprising a plurality of packages mounted on said substrate independently of each other, said monolithic microwave integrated circuits being enclosed and sealed in said packages, respectively.

14. A high-frequency module according to claim 12, wherein said planar array antenna elements are arrayed in one direction.

15. A high-frequency module according to claim 12, wherein said monolithic microwave integrated circuits control the directivity of beams transmitted from said planar array antenna elements.

16. A high-frequency module comprising:
a substrate;
an antenna assembly comprising a plurality of planar array antenna elements mounted on a surface of said substrate independently of each other, said planar antenna elements having respective feeder lines;
a plurality of monolithic microwave integrated circuits mounted on said surface of the substrate, said monolithic microwave integrated circuits being connected to said feeder lines and positioned closely to each other; and
a plurality of circuits mounted on an opposite surface of said substrate remotely from said antenna assembly and said monolithic microwave integrated circuits, for processing input signals to be supplied to and output signals supplied from said monolithic microwave integrated circuits.

17. A high-frequency module according to claim 16, further comprising a plurality of packages mounted on said substrate independently of each other, said monolithic microwave integrated circuits being enclosed and sealed in said packages, respectively.

18. A high-frequency module according to claim 16, wherein said planar array antenna elements are arrayed in one direction.

19. A high-frequency module according to claim 16, wherein said monolithic microwave integrated circuits control the directivity of beams transmitted from said planar array antenna elements.

20. A monolithic microwave integrated circuit package comprising:
a metal substrate;
a high-frequency integrated circuit mounted on one surface of said metal substrate; and
a low-frequency integrated circuit mounted on an opposite surface of said metal substrate and electrically connected to said high-frequency integrated circuit.

21. A monolithic microwave integrated circuit package according to claim 20, further comprising an electrically conductive element extending through said metal substrate from said one surface to said opposite surface, said high-frequency integrated circuit and said low-frequency integrated circuit being electrically connected to each other by said electrically conductive element.

22. A monolithic microwave integrated circuit package according to claim 20, further comprising a dielectric substrate mounted on said one surface of the metal substrate, and a terminal mounted on said dielectric substrate for supplying an input signal to and an output signal from said high-frequency integrated circuit.

23. A monolithic microwave integrated circuit package according to claim 20, wherein said electrically conductive element comprises a plated through hole.

24. A monolithic microwave integrated circuit package comprising:
a metal substrate;
a high-frequency integrated circuit mounted on one surface of said metal substrate; and
a DC bias circuit mounted on an opposite surface of said metal substrate and electrically connected to said high-frequency integrated circuit.

25. A monolithic microwave integrated circuit package according to claim 24, further comprising an electrically conductive element extending through said metal substrate from said one surface to said opposite surface, said high-frequency integrated circuit and said DC bias circuit being electrically connected to each other by said electrically conductive element.

26. A monolithic microwave integrated circuit package according to claim 24, further comprising a dielectric substrate mounted on said one surface of the metal substrate, and a terminal mounted on said dielectric substrate for supplying an input signal to and an output signal from said high-frequency integrated circuit.

27. A monolithic microwave integrated circuit package according to claim 25, wherein said electrically conductive element comprises a plated through hole.

28. A monolithic microwave integrated circuit package comprising:

a metal substrate;

a high-frequency integrated circuit mounted on one surface of said metal substrate; and a low-frequency integrated circuit and a DC bias circuit mounted on an opposite surface of said metal substrate and electrically connected to said high-frequency integrated circuit.

29. A monolithic microwave integrated circuit package according to claim 28, further comprising an electrically conductive element extending through said metal substrate from said one surface to said opposite surface, said high-frequency integrated circuit and said low-frequency integrated circuit being electrically connected to each other by said electrically conductive element, and said high-frequency integrated circuit and said DC bias circuit being electrically connected to each other by said electrically conductive element.

30. A monolithic microwave integrated circuit package according to claim 28, further comprising a dielectric substrate mounted on said one surface of the metal substrate, and a terminal mounted on said dielectric substrate for supplying an input signal to and an output signal from said high-frequency integrated circuit.

31. A monolithic microwave integrated circuit package according to claim 29, wherein each of said electrically conductive elements comprises a plated through hole.

* * * * *